(12) United States Patent
Higashijima et al.

(10) Patent No.: US 9,818,626 B2
(45) Date of Patent: Nov. 14, 2017

(54) SUBSTRATE PROCESSING APPARATUS AND SUBSTRATE PROCESSING METHOD

(71) Applicant: Tokyo Electron Limited, Tokyo (JP)

(72) Inventors: Jiro Higashijima, Kumamoto (JP); Yoshifumi Amano, Kumamoto (JP); Eiichiro Okamoto, Kumamoto (JP); Yuki Ito, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 314 days.

(21) Appl. No.: 14/056,014

(22) Filed: Oct. 17, 2013

(65) Prior Publication Data
US 2014/0116478 A1    May 1, 2014

(30) Foreign Application Priority Data
Oct. 25, 2012 (JP) .................................. 2012-235974

(51) Int. Cl.
*H01L 21/67* (2006.01)
(52) U.S. Cl.
CPC .............................. *H01L 21/67051* (2013.01)

(58) Field of Classification Search
CPC ............................. H01L 21/304; H01L 21/67
USPC ........................................... 134/104.1, 104.2
See application file for complete search history.

(56) References Cited

FOREIGN PATENT DOCUMENTS

| JP | 2003-086567 A | 3/2003 |
|----|---------------|--------|
| JP | 2011-029593 A | 2/2011 |
| JP | 2012-084856 A | 4/2012 |

*Primary Examiner* — Michael Barr
*Assistant Examiner* — Rita Adhlakha
(74) *Attorney, Agent, or Firm* — Abelman, Frayne & Schwab

(57) ABSTRACT

When a substrate W is processed, a ring-shaped protective wall is located above the substrate held by the substrate holding unit and extends in a circumferential direction of the substrate. A radial position of an external periphery of a lower end of the protective wall is the same as a radial position of an internal periphery of a peripheral portion of an upper surface of the substrate held by a substrate holding unit, or is located at a radial outside. A first gap is formed between the protective wall and an upper surface of the substrate, a second gap is formed between the protective wall and a wall that defines the upper opening of the cup, and when the interior space of the cup is exhausted, a gas present above the substrate is introduced through the first gap and the second gap into the interior space of the cup.

11 Claims, 5 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2012-235974, filed on Oct. 25, 2012 with the Japan Patent Office, the disclosure of which is incorporated herein in its entirety by reference.

TECHNICAL FIELD

The present disclosure relates to a substrate processing apparatus and a substrate processing method for processing a peripheral portion of a rotating substrate by supplying a processing liquid to the peripheral portion.

BACKGROUND

A manufacturing process of semiconductor devices includes a peripheral portion cleaning process of removing an unnecessary film or contaminants from a peripheral portion of a semiconductor wafer (hereinafter, simply referred to as a "wafer"), which is a target substrate, by supplying a processing liquid such as a chemical liquid to the peripheral portion of the wafer while rotating the wafer. Such a cleaning is called as a bevel cleaning or an edge cleaning.

Japanese Patent Application Laid-Open No. 2012-84856 discloses a liquid processing apparatus for cleaning a peripheral portion. The liquid processing apparatus includes a vacuum chuck configured to hold a wafer horizontally and rotate the wafer around a vertical axis, a nozzle configured to eject a chemical liquid onto the peripheral portion of the rotating wafer, a cup configured to surrounds the periphery of the wafer to receive a processing liquid scattered from the wafer, and a disc-shaped cover member configured to the upper side of the upper surface of the wafer and seal the upper surface of the cup in close proximity to the upper surface. A chimney-shaped intake pipe is provided from the central portion of the upper surface of the cover member. Further, the cover member is provided with a protrusion that protrudes downward at a position just above the peripheral portion of the wafer. Since the interior space of the cup is at a negative pressure by being evacuated, a down flow of clean air flowing through a housing is sucked from the intake pipe, flows through a space between the upper surface of the wafer and the lower surface of the cover member towards the peripheral portion of the wafer, and flows through a narrow gap formed between the protruding portion of the cover member and the upper surface of the wafer into the inside of the cup. By this gas flow, the mist of the chemical liquid scattered towards the outside of the wafer is prevented from being attached again to the upper surface of the wafer and contaminating the upper surface of the wafer (device forming surface).

However, since the cover member of Japanese Patent Application Laid-Open No. 2012-84856 covers the entire surface of the wafer, the flow resistance from the inlet of the intake pipe to the cup is large. As a result, unless the interior space of the cup is exhausted strongly, a gas flow with a sufficient flow rate may not be obtained at the outlet of the narrow gap.

SUMMARY

The present disclosure provides a substrate processing apparatus including: a substrate holding unit configured to hold a substrate horizontally; a rotation driving mechanism configured to rotate the substrate holding unit around a vertical axis; a processing liquid nozzle configured to supply a processing liquid to a peripheral portion of the substrate held by the substrate holding unit; a cup configured to receive the processing liquid scattered outwardly from the substrate, the cup having an upper opening and enclosing the periphery of the substrate held by the substrate holding unit; an exhaust port configured to exhaust the interior space of the cup; and a ring-shaped protective wall, in which the protective wall is located above the substrate held by the substrate holding unit and extends in a circumferential direction of the substrate, a first gap is formed between the protective wall and an upper surface of the substrate, a second gap is formed between the protective wall and a wall that defines the upper opening of the cup, a radial position of an external periphery of the lower end of the protective wall is the same as a radial position of an internal periphery of the peripheral portion of the upper surface of the substrate held by the substrate holding unit, or is located at a radial outside, and when the interior space of the cup is exhausted via the exhaust port, a gas present above the substrate is introduced through the first gap and the second gap into the interior space of the cup.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5A is a view illustrating flows of liquids, and FIG. 5B is a view illustrating flows of air current and mist entrained in the air current.

DETAILED DESCRIPTION

Figure 1:
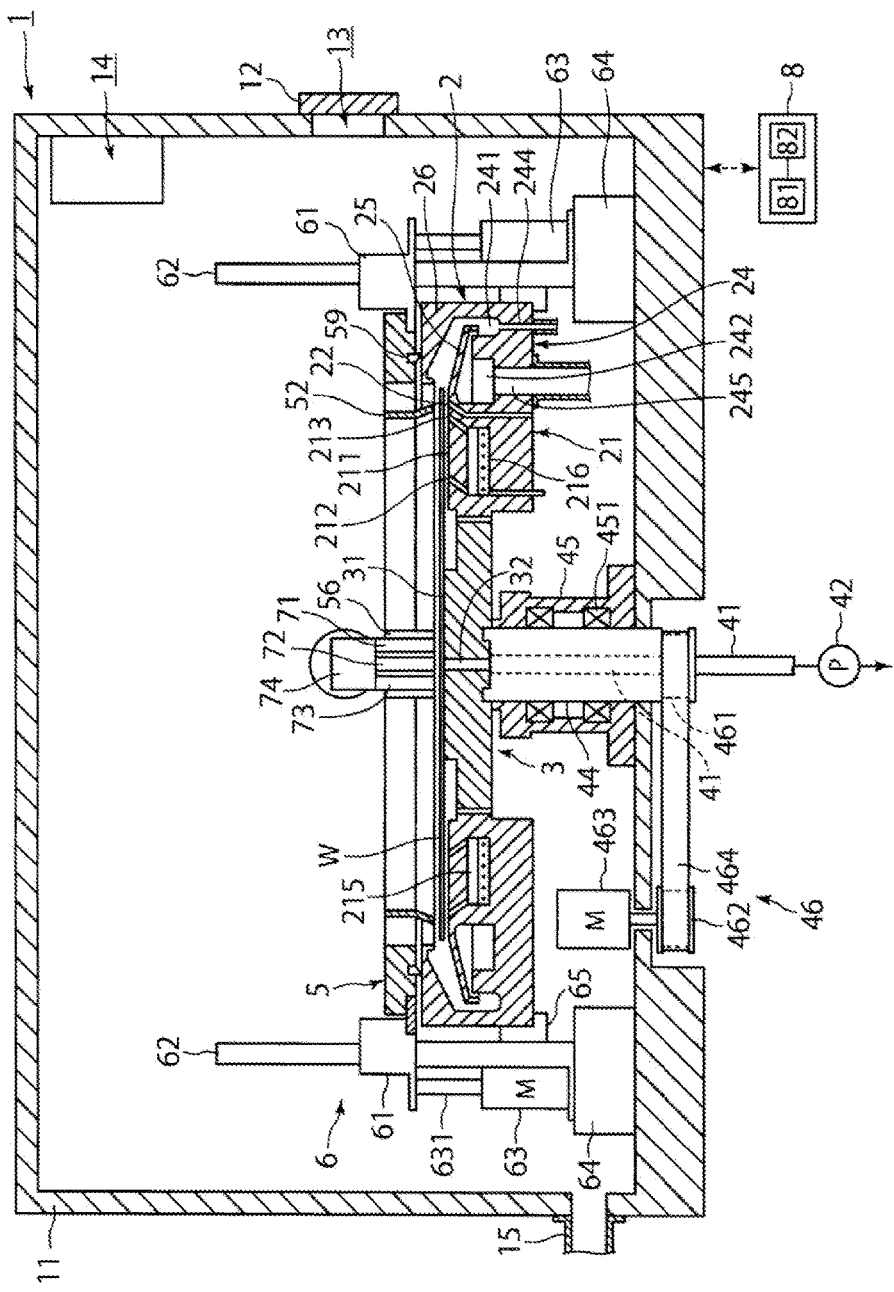
FIG. 1 is a longitudinal cross-sectional side view of a liquid processing apparatus according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a technique capable of effectively suppressing a processing liquid supplied to a substrate from being scattered and adhered again onto the substrate, while reducing a load on an exhaust apparatus that exhaust a cup.

The present disclosure provides a substrate processing apparatus including: a substrate holding unit configured to hold a substrate horizontally; a rotation driving mechanism configured to rotate the substrate holding unit around a vertical axis; a processing liquid nozzle configured to supply a processing liquid to a peripheral portion of the substrate held by the substrate holding unit; a cup configured to receive the processing liquid scattered outwardly from the substrate, the cup having an upper opening and enclosing the periphery of the substrate held by the substrate holding unit; an exhaust port configured to exhaust the interior space of the cup; and a ring-shaped protective wall, in which the protective wall is located above the substrate held by the substrate holding unit and extends in a circumferential direction of the substrate, a first gap is formed between the protective wall and an upper surface of the substrate, a second gap is formed between the protective wall and a wall that defines the upper opening of the cup, a radial position of an external periphery of the lower end of the protective wall is the same as a radial position of an internal periphery of the peripheral portion of the upper surface of the substrate held by the substrate holding unit, or is located at a radial outside, and when the interior space of the cup is exhausted via the exhaust port, a gas present above the substrate is introduced through the first gap and the second gap into the interior space of the cup.

In the above-described substrate processing apparatus, the external periphery of the lower end of the protective wall is located at an inner position than the external peripheral end of the substrate in a radial direction. Further, the external periphery of the lower end of the protective wall extends along the internal periphery of the peripheral portion of the upper surface of the substrate held by the substrate holding unit.

In the above-described substrate processing apparatus, as an inside surface and an outside surface in a lower side portion of the protective wall come close to the substrate, the inside surface and the outside surface are inclined towards a radial outside. Further, an angle formed by the inside surface of the protective wall and a vertical surface in an upper side portion of the protective wall is smaller than an angle formed by the inside surface of the protective wall and the vertical surface in the lower side portion of the protective wall, and an angle formed by the outside surface of the protective wall and the vertical surface in the upper side portion of the protective wall is smaller than an angle formed by the outside surface of the protective wall and the vertical surface in the lower side portion of the protective wall.

In the above-described substrate processing apparatus, the protective wall is provided as a part of a generally ring-shaped cover member, the cover member includes a base that surrounds the outside of the protective wall and a plurality of connecting members that connect the protective wall, a peripheral gap extending along the circumferential direction is formed between an inside surface of the base and the outside surface of the protective wall, and the peripheral gap is connected to the second gap.

In the above-described substrate processing apparatus, the wall that defines the upper opening of the cup is provided with a folded portion that extends downwardly.

In the above-described substrate processing apparatus, a height of the protective wall is larger than a height of bounce of the processing liquid scattered outwardly from the substrate.

In the above-described substrate processing apparatus, a flow rate of the gas flowing through the second gap is larger than a flow rate of the gas flowing through the first gap.

The substrate processing apparatus further includes a moving mechanism configured to move the protective wall between a processing position that comes close to the upper surface of the substrate held by the substrate holding unit and a retreat position apart from the surface.

Further, the present disclosure provides a substrate processing method including: holding a substrate horizontally in a state where the periphery of the substrate is enclosed by a cup, and a ring-shaped protective wall extending along the circumferential direction of the substrate is disposed above the substrate; and performing a liquid processing on the substrate by supplying a processing liquid to a peripheral portion of the substrate in a state where the interior space of the cup is exhausted and the substrate is rotated around a vertical axis, in which, when the liquid processing is performed on the substrate, the protective wall is located above the substrate held by the substrate holding unit and extends in a circumferential direction of the substrate, a first gap is formed between the protective wall and an upper surface of the substrate, a second gap is formed between the protective wall and a wall that defines the upper opening of the cup, a radial position of an external periphery of the lower end of the protective wall is the same as a radial position of an internal periphery of the peripheral portion of the upper surface of the substrate held by the substrate holding unit, or is located at a radial outside, and when the interior space of the cup is exhausted via the exhaust port, a gas present above the substrate is introduced through the first gap and the second gap into the interior space of the cup.

In the substrate processing method, the protective wall prevents a processing liquid that is scattered outwardly from the substrate to bounce off the cup from going over the protective wall and invading more inwardly than the peripheral portion of an upper surface of the substrate.

According to the present disclosure, since a first gap is formed between the protective wall and an upper surface of the substrate, a second gap is formed between the protective wall and a wall that defines the upper opening of the cup, and gas is drawn through the first gap and the second gap into the cup, by appropriately switching supplying of the first gas and the second gas of different temperatures, flow resistance may be reduced when exhausting the cup, thereby reducing the load of the exhaust apparatus that exhausts the cup.

An exemplary embodiment of a substrate processing apparatus of the present disclosure will be described with respect to a liquid apparatus that supplies a hydrofluoric acid (HF) solution, which is a chemical liquid, to a surface of a wafer W, which is a disc-shaped substrate where semiconductor devices are formed, to remove an unnecessary film formed on the peripheral portion of the wafer W.

Figure 2:
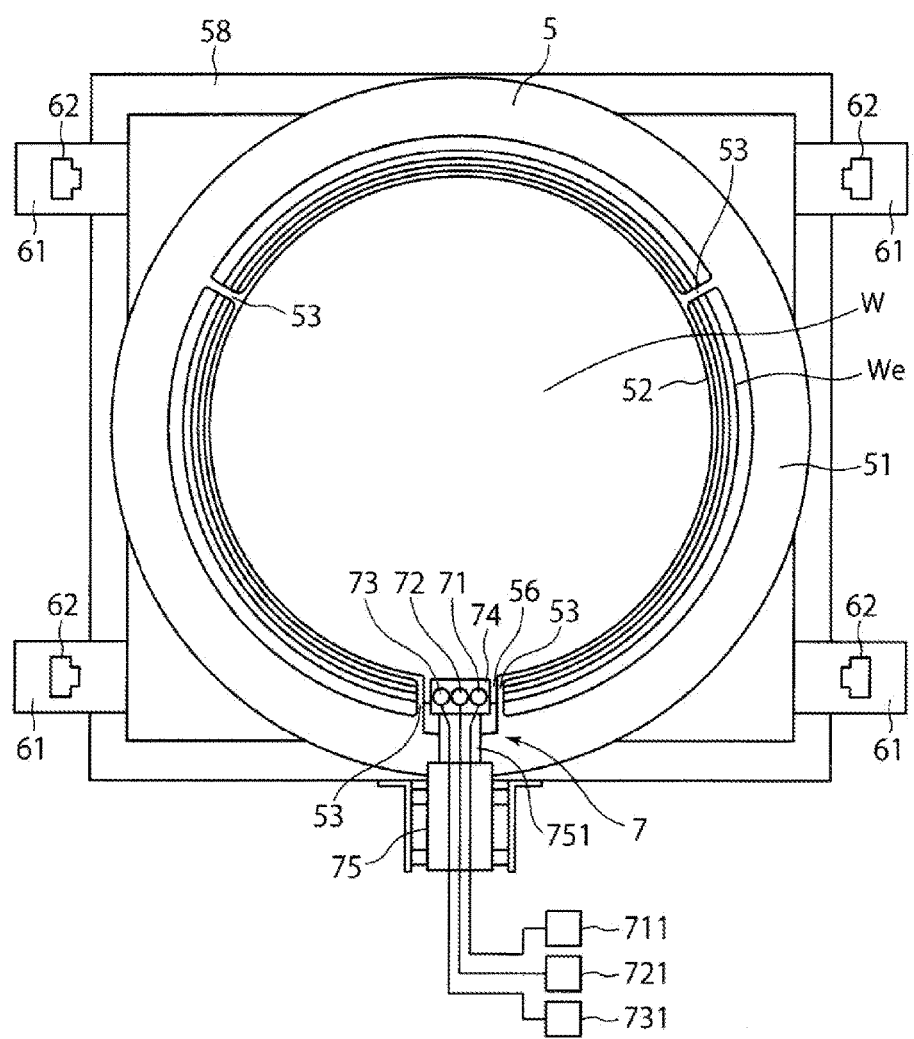
FIG. 2 is a plan view illustrating a cover member, an elevation mechanism and a supplying unit of the liquid processing apparatus illustrated in FIG. 1.

As illustrated in FIGS. 1 and 2, a liquid processing apparatus 1 includes: a wafer holding unit 3 configured to hold a wafer W rotatably around a vertical axis in a horizontal posture; a cup 2 configured to enclose the periphery of the wafer W held on the wafer holding unit 3 and receive a processing liquid scattered from the wafer W; a cover member 5 having a ring-shaped protective wall located above a peripheral portion of an upper surface of the wafer W held in the wafer holding unit 3; an elevation mechanism (moving mechanism) 6 configured to move up and down the cover member 5; and a processing fluid supplying unit 7 configured to supply the processing fluid to the wafer W held on the wafer holding unit 3.

The constitutional elements of the liquid processing apparatus as described above such as, for example, the cup 2, the wafer holding unit 3, and the cover member 5, are accommodated in one housing 11. A clean air introducing unit 14 configured to introduce clean air from the outside is provided in the vicinity of the ceiling of the housing 11. Further, an exhaust port 15 configured to exhaust the atmosphere in the housing 11 is provided in the vicinity of the bottom surface of the housing 11. As a result, downflow of the clean air is formed in the housing 11, flowing from the upper portion of the housing 11 towards the lower portion. A carrying-in/out port 13 is provided at a side wall which is opened/closed by a shutter 12. A transportation arm (not illustrated) provided outside the housing 11 may pass through the carrying-in/out port 13 in a state where the wafer W is held thereon.

The wafer holding unit 3 is constituted with a disc-shaped vacuum chuck, and the upper surface of the wafer holding unit 3 is formed as a wafer adsorption surface 31. A suction port 32 is opened at the central portion of the wafer adsorption surface 31. A hollow cylindrical rotation shaft 44 extends vertically from the central portion of the lower surface of the wafer holding unit 3. A suction conduit (not illustrated) passes through the interior space of the rotation shaft 44 and is connected to the suction port 32. The suction conduit is connected to a vacuum pump 42 in the outside of the housing 11. When the vacuum pump 42 is driven, the wafer W may be sucked by the wafer holding unit 3.

The rotation shaft 44 is supported in a bearing casing 45 in which a bearing 451 is embedded, and the bearing casing 45 is supported on the bottom surface of the housing 11. The rotation shaft 44 may be rotated at a predetermined speed by a rotation driving mechanism 46 including a driven pulley 461 on the rotation shaft 44, a driving pulley 462 on a rotation shaft of a driving motor 463, and a driving belt 464 extending between the driven pulley 461 and the driving pulley 462.

Figure 3:
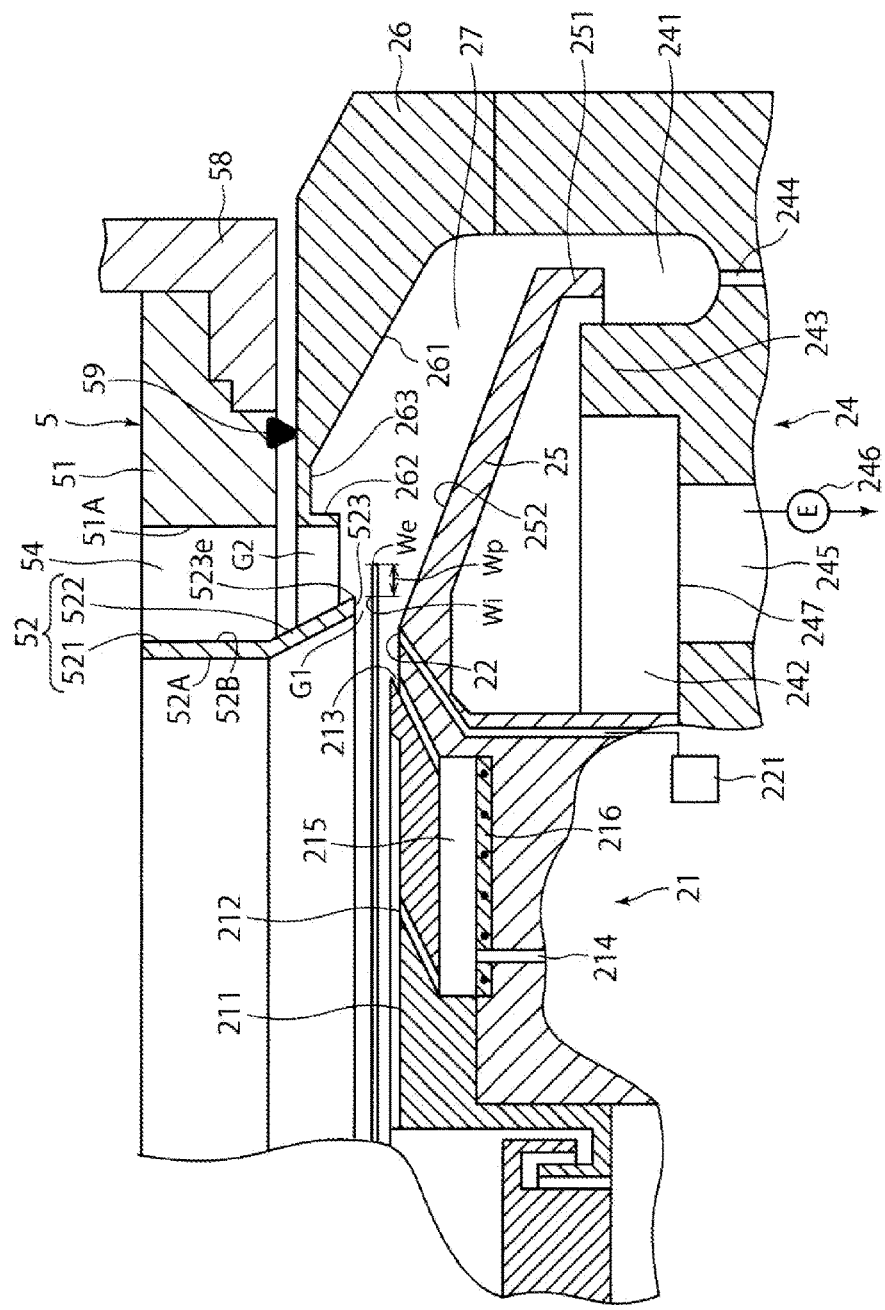
FIG. 3 is a cross-sectional view illustrating a region in the vicinity of an external periphery of the right wafer in FIG. 1 in detail in an enlarged scale.

As illustrated in FIG. 3, the cup 2 is a bottomed annular member configured to enclose the external periphery of the wafer holding unit 3. The cup 2 serves to receive and recover the chemical liquid scattered outwardly from the wafer W after the chemical liquid is supplied to the wafer W, and eject the chemical liquid to the outside.

A relatively small gap (e.g., having a height of about 2 mm to 3 mm) is formed between the lower surface of the wafer W held by the wafer holding unit 3 and the upper surface 211 of an internal peripheral side portion 21 of the cup 2 facing the lower surface of the wafer W. Two gas ejection ports 212, 213 are opened on the upper surface 211 which is opposite to the wafer W. The two gas ejection ports 212, 213 extend continuously along the concentric large-diameter circumference and small-diameter circumference, respectively, and eject hot $N_2$ gas (heated nitrogen gas) towards the lower surface of the wafer W in a radially outward and obliquely upward direction.

The $N_2$ gas is supplied from one or a plurality of gas introduction lines 214 (only one illustrated in the figure) formed in the inside of the internal peripheral side portion 21 of the cup 2 to an annular gas diffusion space 215. The $N_2$ gas flows through the gas diffusion space 215 while spreading in the circumferential direction, and is ejected from the gas ejection ports 212, 213. A heater 216 is provided in the vicinity of the gas diffusion space 215. Accordingly, the $N_2$ gas is heated when the flowing through the gas diffusion space 215, and then, ejected from the gas ejection ports 212, 213. The $N_2$ gas ejected from the gas ejection port 213, which is disposed radially outside, heats up the peripheral portion of the wafer W, which is a part to be processed, to promote reaction with the chemical liquid. Also, the $N_2$ gas suppresses the mist of the processing liquid, which has been ejected towards the front surface (upper surface) of the wafer W and then scattered, from coming back to the back surface (lower surface) of the wafer. The $N_2$ gas ejected from the gas ejection port 212, which is disposed radially inside, suppresses deformation of the wafer W. The deformation may be caused because only the peripheral portion of the wafer W may be heated unless the gas ejection port 212 is provided and a negative pressure is generated near the lower surface of the wafer W at the central side of the wafer W.

In an external peripheral portion 21 of the cup 2, two top-opened annular recesses 241, 242 are formed along the peripheral direction of the cup 2. The recesses 241, 242 are partitioned from each other by an annular separation wall 243. A drain path 244 is connected to the bottom of the outer recess 241. Further, an exhaust port 247 is provided in the bottom of the inner recess 242, and an exhaust path 245 is connected to the exhaust port 247. An exhaust apparatus 246 such as, for example, an ejector or a vacuum pump, is connected to the exhaust path 245. During the operation of the liquid processing apparatus 1, the interior space of the cup 2 is normally exhausted to maintain the pressure in the inside of the inner recess 242 lower than the pressure in the inside of the housing 11 in the outside of the cup 2.

A ring-shaped guide plate 25 extends from the external periphery of the internal peripheral portion 21 of the cup 2 (a downward position of the peripheral portion of the wafer W) towards the radial outside. The guide plate 25 is inclined to become lower as it goes in the radial direction. The guide plate 25 covers the entire inner recess 242 and the upside of the internal peripheral portion of the outer recess 241. The front end 251 of the guide plate 25 (the radial external peripheral portion) is bent downwardly and enters into the outer recess 241.

Further, an external peripheral wall 26 which is continuous with an outer wall surface of the outer recess 241 is provided in the external periphery of the external peripheral portion 24 of the cup 2. The outer peripheral wall 26 receives fluid (e.g., liquid droplets, gas or a mixture thereof) scattered outwardly from the wafer W by the internal peripheral surface thereof, and guides the fluid towards the outer recess 241. The external peripheral wall 26 includes a fluid receiving surface 261 in the inside thereof which is inclined at an angle of 25° to 30° with respect to the horizontal surface to be lowered towards the radial outside, and a folded portion 262 that extends downwardly from the upper end of the fluid receiving surface 261. In the example as illustrated, the fluid receiving surface 261 formed as an inclined surface is connected via a horizontal surface 263 to the folded portion 262. However, a curved surface may be provided instead of the horizontal surface 263, or the folded portion 262 may be connected directly to the upper end of the fluid receiving surface 261 without the horizontal surface 263. An exhaust fluid path 27 that allows gas (e.g., air or $N_2$ gas) and liquid droplets scattered from the wafer W to flow is formed between an upper surface 252 of the guide plate 25 and the fluid receiving surface 261. Meanwhile, the upper opening of the cup 2 is defined by the internal peripheral surface of the folded portion 262, but the opening diameter of the upper opening is slightly larger than the diameter of the wafer W.

A mixed fluid of the gas and the liquid droplets introduced through the exhaust fluid path 27 into the outer recess 241 flows between the guide plate 25 and the separation wall 243 and is introduced into the inner recess 242. When the mixed fluid passes between the guide plate 25 and the separation wall 243, the flow direction of the mixed fluid is sharply turned. Accordingly, the liquid (droplets) included in the mixed fluid is separated from the fluid by collision with the front end 251 of the guide plate 25 or the separation wall 243, introduced into the outer recess 241 along the lower surface of the guide plate 25 or the surface of the separation wall 243, and discharged from the drain path 244. The fluid in which liquid droplets have been removed is introduced into the inner recess 242, and then, discharged from the exhaust path 245.

The cover member 5 is a generally ring-shaped member disposed to face the peripheral portion of the upper opening of the cup 2 when the processing is performed.

As illustrated in FIGS. 1 to 3, the cover member 5 includes a ring-shaped base 51, a ring-shaped protective wall 52 disposed inside the base 51 and a plurality of connecting members 53 that connect the base 51 and the protective wall 52. A peripheral gap extending along the circumferential direction is formed between the inside surface (internal peripheral surface) 51A of the base 51 and the outside surface (external peripheral surface) 52B of the protective wall. The peripheral gap is divided at the positions of the connecting members 53.

The lower end 523 of the protective wall 52 (specifically, both of the external periphery and the internal periphery of the lower end 523) is located more inwardly than the external peripheral end We of the wafer W. A first gap G1 is formed between the lower end 523 and the upper surface of the wafer W. Further, a second gap G2 is formed between the wall surface that defines the upper opening of the cup 2 (the internal peripheral surface of the folded portion 262) and the outside surface 52B of the protective wall 52. The second gap G2 is connected to a peripheral gap 54 formed between the inside surface 51A of the base 51 of the cover member 5 and the outside surface 52B of the protective wall 52.

The protective wall 52 has a function as a shield to suppress the processing liquid scattered outwardly from the wafer W after supplied to the wafer W from being adhered again to the wafer W, and a function to rectify a gas stream drawn from the upper side of the wafer W into the cup 2. These functions will be described below. The protective wall 52 has an upper side portion 521 that extends vertically and a lower side portion 522 that extends obliquely. Specifically, in the lower side portion 522, the inside surface (internal peripheral surface) 52A of the protective wall is directed obliquely downwardly, and is inclined to be directed towards the radial outside as the inside surface comes close to the wafer W. Further, in the upper side portion 521 of the protective wall, both of the inside surface 52A and the outside surface 52B of the protective wall W extend vertically. Meanwhile, the angle formed between the inside surface 52A of the protective wall 52 and the vertical surface in the upper side portion 521 of the protective wall 52 is not limited to zero degrees as described above and may be set to any value that is smaller than the angle formed between the inside surface of the protective wall 52 and the vertical surface in the lower side portion 522 of the protective wall 52. Further, the angle formed between the outside surface 52B of the protective wall 52 and the vertical surface in the upper side portion 521 of the protective wall 52 is not limited to zero degrees and may be set to any angle that is smaller than the angle formed between the outside surface 52B of the protective wall 52 and the vertical surface in the lower side portion 522 of the protective wall 52.

The external periphery 523e of the lower end 523 of the protective wall 52 is located just above a position which is displaced inwardly in the radial direction by a predetermined distance L from the external peripheral end We of the wafer W. The predetermined distance L is, for example, 2 mm to 3 mm. The predetermined distance L is determined depending on the expansion of a device forming region of the device forming surface (the front surface of the wafer) of the wafer W which is an upper surface during the processing. Specifically, a radial position of the external periphery 523e of the lower end 523 of the protective wall corresponding to the predetermined distance L is determined to be in a range of a peripheral portion Wp of the wafer W (including a case where the radial position is in accord with a radial position of the internal periphery Wi of the peripheral portion Wp), and at the same position as or a position (the central side of the wafer W) inside of the radial position of the supply position $P_L$ (see FIG. 5A) of the processing liquid. Here, the "peripheral portion Wp of the wafer W (see FIG. 3)" refers to a circular ring-shaped region (including a circumscribed circle) from the circumscribed circle (that is, a circle which takes the center of the wafer W as a center and has a minimum radius determined so that the device forming region is not included at all in the outside of this circle) to the external peripheral end We of the wafer W. Further, "the internal periphery Wi of the peripheral portion Wp of the wafer W" is in accord with the circumscribed circle. In this case, the external periphery 523e of the lower end 523 of the protective wall 52 extends along the internal periphery Wi of the peripheral portion Wp of the wafer W.

FIG. 2 is a plan view illustrating a state where the wafer W is held on the wafer holding unit 3 and the cover member 5 is located at a processing position. In FIG. 2, the symbol We represents the external peripheral end (edge) of the wafer W. Since the central portion of the cover member 5 is opened as illustrated in FIG. 2, the flow resistance of the fluid path formed between the lower end of the cover member and the wafer W becomes smaller as compared with the disc-shaped cover member that covers the substantially entire surface of the wafer in the related art. Accordingly, even if the exhaust capability to exhaust the interior space of the cup 2 is low, sufficient exhaust may be performed. Further, since most of the upper surface of the wafer W excluding the peripheral portion is not covered by the cover member 5, the surface of the wafer W may be monitored during the processing, for example, by providing a camera in the housing 11. Further, the surface of the wafer W may also be checked during the processing by providing a transparent window in the housing 11.

As illustrated in FIGS. 1 and 2, the elevation mechanism 6 configured to move up and down the cover member 5 includes a plurality (four in this example) of sliders 61 fixed to a support 58 that supports the cover member 5, and guide pillars 62 that penetrate the respective sliders 61 and extend vertically. A linear actuator, for example, a rod 631 of a cylinder motor 63 is connected to each of the respective sliders 61. When the cylinder motor 63 is driven, the slider 61 is moved up and down along the guide pillar 62, and thus, is capable of moving up and down the cover member 5. The cup 2 is supported by a lifter 65 that constitutes a part of a cup elevation mechanism (details are not illustrated). As the lifter 65 is moved down from the state illustrated in FIG. 1, the cup 2 descends, and thus, the wafer W may be transferred between a transportation arm of a wafer transportation mechanism (not illustrated) and the wafer holding unit 3.

Next, referring to FIGS. 1, 2 and 4, the processing fluid supplying unit 7 will be described. Particularly, as clearly illustrated in FIG. 2, the processing fluid supplying unit 7 includes a chemical liquid nozzle 71 configured to eject a chemical liquid (HF in this example), a rinse nozzle 72 configured to eject a rinse liquid (deionized water (DIW) in this example), and a gas nozzle 73 configured to eject a gas for drying ($N_2$ gas in this example). The chemical liquid nozzle 71, a rinse nozzle 72 and a gas nozzle 73 are attached to a common nozzle holder 74. The nozzle holder 74 is attached to a linear actuator, for example, a rod 751 of a cylinder motor 75, which is in turn attached to the support 58 configured to support the cover member 5. When the cylinder motor 75 is driven, a supply position of the processing fluid onto the wafer W may be moved from the nozzles 71 to 73 in a radial direction of the wafer W.

Figure 4A:
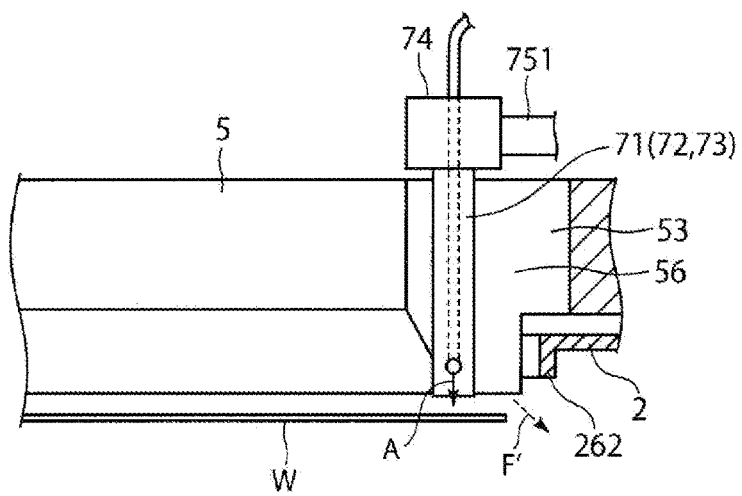
FIG. 4A and FIG. 4B are explanatory views of a nozzle.
Figure 4B:
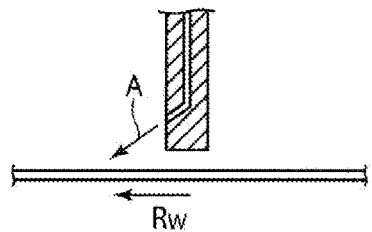

As illustrated in FIGS. 2 and 4A, the nozzles 71 to 73 are accommodated in a recess 56 which is formed in the internal peripheral surface of the cover member 5. The recess 56 is interposed between two connecting members 53. The respective nozzles 71 to 73 direct obliquely downwardly, as illustrated by an arrow A in FIG. 4B, and also, eject the processing fluid such that the ejection direction represented by the arrow A has a component of a rotation direction Rw of the wafer. By doing this, it is possible to suppress generation of mist (liquid droplet generated due to collision of the processing liquid with the wafer W) which may be generated in a case where the processing fluid is liquid. The processing fluid is supplied from processing fluid supply mechanisms 711, 721, 731 as schematically illustrated in FIG. 2 to the respective nozzles 71 to 73. Each of the processing liquid supply mechanisms 711, 721, 731 may be constituted by a processing fluid supply source such as a tank, a pipeline that supplies the processing fluid from the processing fluid supply source to the nozzles, and a flow control device such as an opening/closing valve or a flow-rate adjusting valve installed in the pipeline.

Further, as illustrated in FIG. 3, in the internal peripheral side portion 21 of the cup 2, a plurality (only one illustrated in the figure) of processing liquid ejection ports 22 are formed at different positions with respect to the circumferential direction outside of the gas ejection port 213. The respective processing liquid ejection ports 22 eject the processing fluid outwardly from the wafer W and obliquely upwardly towards the peripheral portion of the lower surface of the wafer W. From at least one of the processing liquid ejection ports 22, the same chemical liquid as the chemical liquid ejected from the chemical liquid nozzle 71 may be ejected. Further, from at least another one of the processing liquid ejection ports 22, the same rinse liquid as the rinse liquid ejected from the rinse nozzle 72 may be ejected. As illustrated in FIG. 3, a process fluid supply mechanism 221 having the same configuration as the above-mentioned nozzles 71 to 73 is connected to each of the processing liquid ejection ports 22.

As schematically illustrated in FIG. 1, the liquid processing apparatus 1 includes a controller (control unit) 8 configured to integrally control the entire operations thereof. The controller 8 controls the operations of all functional parts (for example, the rotation driving mechanism 46, the elevation mechanism 6, the vacuum pump 42, and various processing fluid supply mechanisms). The controller 8 may be implemented using, for example, a general purpose computer as a hardware and a program (an apparatus control program and a processing recipe) to operate the computer as a software. The software may be stored in a storage medium such as, for example, a hard disc drive which is fixedly provided in the computer, or in a storage medium such as, for example, a CD-ROM, a DVD and a flash memory which are removably set in the computer. The storage medium is indicated by a reference numeral 81 in FIG. 1. A processor 82 accesses and executes a predetermined processing recipe from the storage medium 81 based on, for example, instructions from a user interface (not illustrated) as needed. As a result, each functional component of the liquid processing apparatus 1 is operated to perform a predetermined processing under the control of controller 8.

Next, descriptions will be made on the operation of the liquid processing apparatus 1 performed under the control of the controller 8.

[Carry-in of Wafer]

First, the cover member 5 is disposed at a retreat position (upper position in FIG. 1), and the cup 2 is moved down by the lifter 65 of the cup elevation mechanism. Subsequently, a shutter 12 of the housing 11 is opened to allow a transportation arm (not illustrated) of an external wafer transportation mechanism (not illustrated) to enter the housing 11. Then, the wafer W held by the transportation arm is disposed just above the wafer holder 3. Subsequently, the transportation arm is moved down to a position lower than the upper surface of the wafer holder 3 to dispose the wafer W on the upper surface of the wafer holder 3. Next, the wafer W is adsorbed by the wafer holder 3. Thereafter, the empty transportation arm exits from the inside of the housing 11. Then, the cup 2 is moved up to return to the position as illustrated in FIG. 1, and the cover member 5 is moved down to the processing position as illustrated in FIG. 1. By the above-mentioned procedure, the carry-in of the wafer is completed, and is in a state as illustrated in FIG. 1.

[Chemical Liquid Processing]

Next, a chemical liquid processing is performed on the wafer W. The wafer W is rotated at a predetermined speed (e.g., 2,000 rpm). In addition, hot $N_2$ gas is ejected from the gas ejection ports 212, 213 of the cup 2 to heat the peripheral portion of the wafer W, which is a region to be processed, to a temperature suitable for the chemical liquid processing (e.g., 60° C.). Further, when performing a chemical processing which is not necessary to heat the wafer W, $N_2$ gas at normal temperature may be ejected without operating the heater 216. When the wafer W is heated sufficiently, the chemical liquid (HF) is supplied from the chemical liquid nozzle 71 to the peripheral portion of the upper surface (device forming surface) of the wafer W while rotating the wafer W, thereby removing any unnecessary film in the peripheral portion of the upper surface of the wafer. At the same time, the chemical liquid is supplied from the chemical liquid processing liquid ejection port 22 to the peripheral portion of the lower surface of the wafer W, thereby removing any unnecessary film in the peripheral portion of the lower surface of the wafer. The chemical liquid supplied to the upper and lower surfaces of the wafer W flows while spreading outwardly by centrifugal force, is flowed out of the wafer W together with the removed matters, and is recovered by the cup 2. Further, while the chemical liquid processing is performed, the chemical liquid nozzle 71, which is discharging the chemical liquid by driving the cylinder motor 75, may be reciprocated in the radial direction of the wafer W, thereby enhancing the uniformity of the processing.

[Rinse Processing]

After the chemical liquid processing is performed for a predetermined period of time, a rinse processing is subsequently performed by continuing the rotation of the wafer W and the ejection of $N_2$ gas from the gas ejection ports 212, 213, stopping the ejection of the chemical liquid from the chemical liquid nozzle 71 and the chemical liquid processing liquid ejection port 22, and supplying the rinse liquid (DIW) from the rinse nozzle 72 and the rinse liquid processing liquid ejection port 22 to the peripheral portion of the wafer W. By this rinse processing, the chemical liquid and any reaction products remained on the upper and lower surfaces of the wafer W are washed out.

[Dry Processing]

After the rinse processing is performed for a predetermined period of time, a dry processing is subsequently performed by continuing the rotation of the wafer W and the ejection of $N_2$ gas from the gas ejection ports 212, 213, stopping the ejection of the rinse liquid from the rinse nozzle 72 and the rinse liquid processing liquid ejection port 22, and supplying the gas for drying ($N_2$ gas) from the gas nozzle 73 and the rinse liquid processing liquid ejection port 22 to the peripheral portion of the wafer W. By the above procedure, a series of processings for the wafer W is completed.

[Carry-Out of Wafer]

Thereafter, the cover member 5 is moved up to be disposed at the retreat position, and the cup 2 is moved down. Subsequently, the shutter 12 of the housing 11 is opened to allow the transportation arm (not illustrated) of the external wafer transportation mechanism (not illustrated) to enter the housing 11. Then, the empty transportation arm is disposed below the wafer W held by the wafer holder 3, and then, moved up to receive the wafer W from the wafer holder 3 in a state where the adsorption of the wafer W is stopped. Thereafter, the transportation arm holding the wafer W exits from the inside of the housing 11. By the above-mentioned procedure, a series of processings for one wafer is completed in the liquid processing apparatus.

Next, referring to FIGS. 3 to 5, descriptions will be made in detail on the flow of the fluid in the vicinity of the peripheral portion of the wafer and the configuration of the cup 2 and the cover member 5 related to the flow of the fluid.

When the cover member 5 is located at the processing position, the protective wall 52 is located above the peripheral portion of the wafer W surface, and extends along the circumferential direction of the wafer W. The interior space of the cup 2 is exhausted through the exhaust path 245 and becomes a negative pressure, the gas above the upper surface of the wafer W (a clean air forming a downflow in the housing 11) is drawn through the first gap G1 and the second gap G2 into the exhaust fluid path 27. Further, the $N_2$ gas ejected from the gas ejection ports 212, 213 is flowed out of the space between the upper surface 211 of the internal peripheral portion 21 and the lower surface of the wafer W by an influence of the rotation of the wafer W, and flowed into the exhaust fluid path 27. Such flow of the gas is illustrated in FIG. 5B.

Meanwhile, the chemical liquid supplied from the chemical liquid nozzle 71 to the peripheral portion of the upper surface of the wafer W and the chemical liquid supplied from the chemical liquid processing liquid ejection port 22 to the peripheral portion of the lower surface of the wafer W are diffused towards the peripheral portion of the wafer by centrifugal force and scattered outwardly from the wafer W. Most of the chemical liquid on the upper surface of the wafer W is scattered towards a region $A_R$ interposed between two arrows $A_1$, $A_2$ at the upper side in FIG. 5A. The chemical liquid is scattered the most and also the most strongly in the horizontal direction (direction of the arrow $A_1$), and the amount and force of the chemical liquid scattered are reduced as the scattering direction approaches a direction represented by the arrow $A_2$. Most of the chemical liquid on the lower surface of the wafer W is scattered towards a region $B_R$ interposed between two arrows $B_1$, $B_2$ at the lower side in FIG. 5A. The chemical liquid is scattered the most and also the most strongly in the horizontal direction (direction of the arrow $B_1$), and the amount and power of the chemical liquid scattered are reduced as the scattering direction approaches a direction represented by the arrow $B_2$.

Figure 5A:
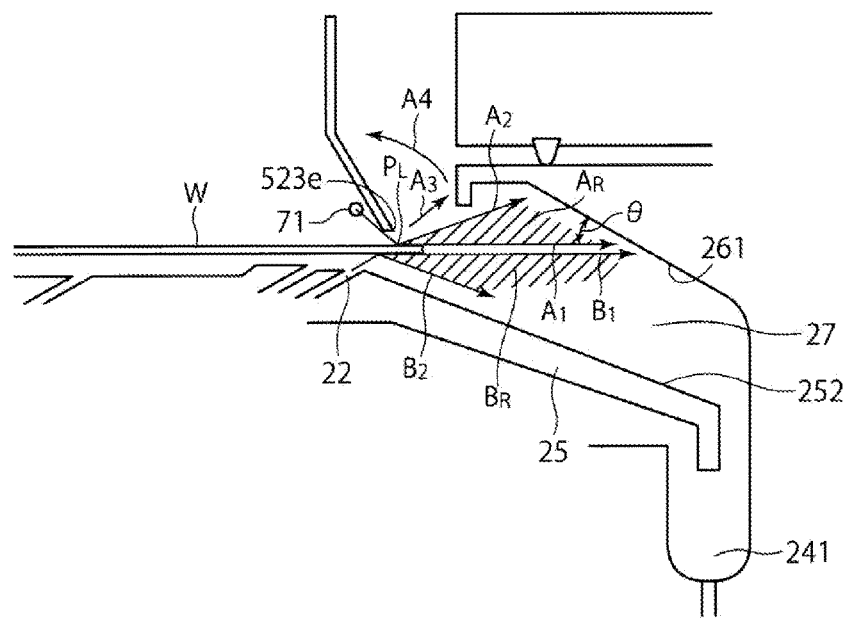
FIG. 5A and FIG. 5B are views illustrating the flows of a processing fluid inside and in the vicinity of a cup.

Further, as illustrated in FIG. 5A, a part of the chemical liquid on the upper surface of the wafer W, although its amount is small, is scattered even towards the internal peripheral surface of the wall (a part of the folded portion 262) that defines the upper opening of the cup 2, as indicated by an arrow $A_3$, and after colliding with the wall 262, bounces towards the upper space of the wafer W, as indicated by an arrow $A_4$. Since the chemical liquid indicated by the arrow $A_4$ collides with the protective wall 52, the chemical liquid does not pass through the space above the central portion of the wafer W over the protective wall 52. Preferably, the protective wall 52 has a height sufficient to exhibit the above-mentioned shielding function thereof (that is, a height higher than the height in which the processing liquid bounces), for example, of about 40 mm or higher, and thus, guarantees that the device forming region is protected from the mist of the chemical liquid. Meanwhile, immediately after the chemical liquid processing, although a small amount of microdroplet of the chemical liquid is attached to the outside of the device forming region, the microdroplet of the chemical liquid is removed in the subsequent rinse processing.

Figure 5B:
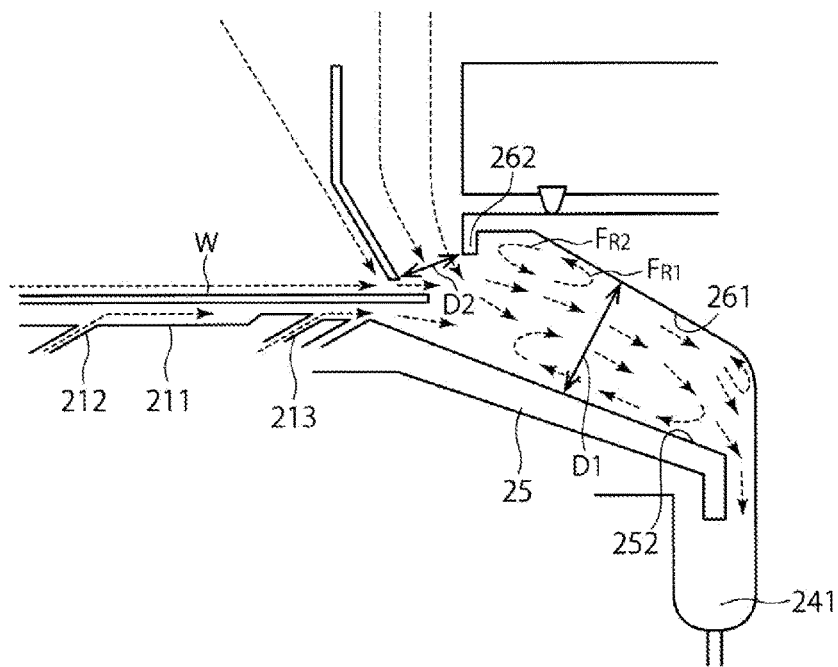

The chemical liquid, which is scattered from the wafer W and enters the exhaust fluid path 27, flows down along the fluid receiving surface 261 and the upper surface 252 of the guide plate 25 towards the recess 241 at the outside of the cup 2, or becomes microdroplet (mist) and flows along the air current within the exhaust fluid path 27 as illustrated in FIG. 5B. The arrow illustrated as a broken line in FIG. 5B represents the air current, and the flow of the mist inside the exhaust fluid path 27 almost accords with the air current within the exhaust fluid path 27.

The first gap G1 is formed such that an air current flowing outwardly flows through the first gap G1 to the extent that the mist of the chemical liquid floating within the exhaust fluid path 27 of the cup 2 may be suppressed from flowing backward in the first gap G1 and passing through the device forming region of the upper surface of the wafer W. Meanwhile, the air current flowed out from the first gap G1 reduces the adhesion of the chemical liquid represented by the arrow A4 in FIG. 5A to the outside of the device forming region of the upper surface of the wafer W. The vertical width of the first gap G1 is preferably set to a relatively small value, for example, about 1 mm. Then, the flow rate of the air current flowing outwardly in the first gap G1 becomes relatively fast. However, if the flow resistance of the first gap G1 becomes too large, it is not desirable in that the gas is substantially drawn into the inside of the exhaust fluid path 27 though the second gap G2 only. The vertical width and radial width of the first gap G1 should be set in consideration of this point. Accordingly, it shall noted that the lower side portion 522 of the protective wall 52 may be constituted to have a downwardly widening cross-sectional shape but not make the flow resistance of the first gap G too large.

Most of the air current drawn into the inside of the exhaust fluid path 27 is introduced through the second gap G2. The minimum width D2 of the second gap G2 (see FIG. 5B) is relatively large, for example, about 5 mm to 6 mm. When the second gap G2 is formed to be relatively large, the flow resistance of the second gap G2 may become small, thereby reducing a load on the exhaust apparatus 246 that exhaust the inside of the cup 2. Meanwhile, it is not desirable for the second gap G2 to be excessively large in that the flow rate of the air current is decreased to lose the directivity and the mist within the exhaust fluid path 27 is not efficiently exhausted. The width of the second gap G2 is set in consideration of this point.

Since the lower side portion 522 of the protective wall 52 is inclined, particularly, the lower side portion 522 of the outside surface 52B of the protective wall 52 is inclined, the air current is flowed out of the second gap G2 to be obliquely directed downwardly and outwardly. Accordingly, the disturbance of the air current is suppressed in the vicinity of the inlet of the exhaust fluid path 27, and thus, the air current is flowed smoothly into the exhaust fluid path 27. Further, since the lower side portion 522 of the protective wall 52 is inclined, particularly, the lower side portion 522 of the inside surface 52A of the protective wall 52 is inclined, the flow flowed into the first gap G1 becomes gradually throttled as the flow approaches the first gap G1, thereby suppressing the disturbance of the air current in the vicinity of the first gap G1. Meanwhile, since the above-mentioned effects are obtained even if the protective wall 52 is not bent, the upper side portion 521 and the lower side portion 522 of the protective 52 may extend continuously in an oblique direction in a rectangular shape, for example, when viewed in a cross-section. In addition, the upper side portion 521 and the lower side portion 522 of the protective 52 may extend continuously in a vertical direction. In this case, the chemical liquid indicated by the arrow A4 in FIG. 5 may also be suppressed from passing through the central portion of the upper surface of the wafer W over the protective wall 52. The chemical liquid may also be suppressed from flowing backward in the first gap G1 and passing through the central portion of the upper surface of the wafer W. Further, since the protective wall 52 has a height sufficient to exhibit the above-mentioned shielding function, the length in the longitudinal direction of the peripheral gap 54 is increased to be capable of straightening the flow of the air current directed to the inside of the second gap G2.

Meanwhile, in the exemplary embodiment as illustrated, in a cross-sectional view, the outline of the inside surface 51A of the base 51 and the outline of the internal peripheral surface of the folded portion 262, which is a wall defining the upper opening of the cup, are aligned vertically on the same straight line. This arrangement is preferred from the viewpoint of suppressing the disturbance of the air current in the vicinity of the second gap G2. However, the arrangement is not limited thereto. Both of the outlines may be out of alignment. For example, the outline of the inside surface 51A of the base 51 may be inclined.

In addition to the above-mentioned configuration, in order to prevent contamination of the wafer W due to the re-adhesion of the mist of the chemical liquid, the cup 2 and the cover member 5 according to the present exemplary embodiment further include an advantageous configuration as follows.

In order to suppress the bounce of the chemical liquid which is strongly incident on the fluid receiving surface 261 of the cup 2, the angle formed by the fluid receiving surface 261 of the cup 2 in relation to the horizontal surface (this is the same as the incident angle θ at which the flow of the chemical liquid indicated by the arrows $A_1$, $B_2$ is incident on the fluid receiving surface 261) is set to a relatively small value, for example, 30°. Further, a region in the vicinity of the incident position of the chemical liquid indicated by the arrows $A_1$, $B_1$ on the fluid receiving surface 261 is formed of a hydrophilic material, for example, hydrophilic surface-treated polychlorotrifluoroethylene (PCTFE). Accordingly, the chemical liquid is stuck on the fluid receiving surface 261 at the moment of the collision with the fluid receiving surface 261, thereby reducing the scattering of the chemical liquid caused by the collision with the fluid receiving surface 261.

The distance D1 between the fluid receiving surface 261 and the upper surface 252 of the guide plate 25 is gradually reduced as it goes downstream (as it approaches the recess 241 at the outside of the cup 2). Then, backflow of air current is reduced. Further, at a point where the distance D1 decreases sharply, backflow of air current occurs with the sharp increase in flow resistance. At a position near the front end 251 of the guide plate 25, backflow of air current occurs because the fluid path is sharply narrowed. However, since the position near the front end 251 is far from the wafer W, the affection of the backflow of the air current is small.

Meanwhile, since the cup 2 is provided with the folded portion 262, even if backflow of air current occurs as indicated by an arrow $F_{R1}$ in FIG. 5B, the backflow is blocked by the folded portion 262 and turned to the downstream side as indicated by an arrow $F_{R2}$. Accordingly, the mist of the chemical liquid entrained in the air current indicated by the arrow $F_{R1}$ is suppressed from being directed to the wafer W.

When the cover member 5 is located at the processing position, it is desirable that the space between the cover member 5 and the upper surface of the external peripheral wall 25 is sealed by a seal member 59, as illustrated in FIG. 3. With this arrangement, the gas inside the housing 11 is introduced only through the first gap G1 and the second gap G2 into the exhaust fluid path 27. Thus, the disturbance of the air current hardly occurs in the vicinity of the external periphery of the wafer W, and a load on the exhaust apparatus 246 may be reduced as well.

However, in the portion where the recess 56 of the ring-shaped cover member 5 is provided, the gas within the housing 11 is introduced into the exhaust fluid path 27, not through the first gap G1 and the second gap G2, but through the gap between the wall surface that partitions the recess 56 and the nozzles 71 to 73 and the gap between the nozzles 71 to 73 and the upper surface of the wafer W. Therefore, in this portion, the effect of preventing the contamination of the wafer W is somewhat inferior. However, in this portion, an air current F' directed to the exhaust fluid path 27 (see FIG. 4A) is present in the gap between the folded portion 262 of the cup 2 and the external periphery of the wafer W, and an air current dragged to the air current directed to the exhaust fluid path 27 through the first gap G1 and the second gap G2 also occurs in both lateral portions of the recess 56. Accordingly, the adverse effect caused by providing the recess 56 is negligible.

Meanwhile, the flows of air current and of mist in the chemical liquid processing have been described above. However, it is evident that the flows of air current and mist are also generated similarly in the rinse processing.

The liquid processing performed by the liquid processing apparatus 1 is not limited to the foregoing. For example, the chemical liquid is not limited to HF, but may be SC-1 or SC-2. Further, the chemical liquid processing may be performed several times. In addition, the substrate to be processed is not limited to a semiconductor wafer, but may be various circular substrates of which the peripheral portion is required to be cleaned, for example, a glass substrate and a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate holding unit configured to hold a substrate horizontally;
a rotation driving mechanism configured to rotate the substrate holding unit around a vertical axis;
a processing liquid nozzle configured to supply a processing liquid to a peripheral portion of the substrate held by the substrate holding unit;
a cup configured to receive the processing liquid scattered outwardly from the substrate, the cup having an upper opening and enclosing the periphery of the substrate held by the substrate holding unit;
an exhaust port configured to exhaust the interior space of the cup; and
a ring-shaped protective wall located above the substrate such that a peripheral edge of the protective wall does not extend beyond a peripheral edge of the substrate, the protective wall having a top portion that has internal and external walls oriented vertically and a lower portion that has the internal and external walls angled out obliquely toward the peripheral edge of the substrate,
a first gap is formed between the protective wall and an upper surface of the substrate,
a second gap is formed between the protective wall and a wall that defines the upper opening of the cup along the entire circumferential direction of the substrate, and
when the interior space of the cup is exhausted via the exhaust port, a gas present above the substrate is introduced through the first gap and the second gap into the interior space of the cup along the entire circumferential direction of the substrate.

2. The substrate processing apparatus of claim 1, wherein a periphery of the protective wall has a radius less than that of the substrate.

3. The substrate processing apparatus of claim 2, wherein the periphery of the protective wall extends along an internal periphery of the peripheral portion of the upper surface of the substrate.

4. The substrate processing apparatus of claim 1, wherein the protective wall is provided as a part of, a generally ring-shaped cover member, the cover member includes a base that surrounds the outside of the protective wall and a plurality of connecting members that connect the protective wall, a peripheral gap extending along the circumferential direction is formed between an inside surface of the base and the outside surface of the protective wall, and the peripheral gap is connected to the second gap.

5. The substrate processing apparatus of claim 4, wherein the wall that defines the upper opening of the cup is provided with a folded portion that extends downwardly.

6. The substrate processing apparatus of claim 5, wherein an outline of the inside surface of the base and an outline of an internal peripheral surface of the folded portion are aligned vertically on the same straight line when viewed in a vertical cross-section.

7. The substrate processing apparatus of claim 4, wherein a central portion of the cover member is opened.

8. The substrate processing apparatus of claim 1, wherein a height of the protective wall is larger than a height that the processing liquid scattered outwardly from the substrate bounces.

9. The substrate processing apparatus of claim 1, wherein a flow rate of the gas flowing through the second gap is larger than a flow rate of the gas flowing through the first gap.

10. The substrate processing apparatus of claim 1, further comprising a moving mechanism configured to move the protective wall between a processing position directly above the upper surface of the substrate held by the substrate holding unit and a retreat position apart from the surface.

11. The substrate processing apparatus of claim 1, wherein the top portion and the lower portion of the protective wall extend continuously in an oblique direction in a rectangular shape when viewed in a vertical cross-section.

* * * * *